(12) United States Patent
Balasubramanian et al.

(10) Patent No.: US 7,091,096 B2
(45) Date of Patent: Aug. 15, 2006

(54) METHOD OF FABRICATING CARBON NANOTUBE FIELD-EFFECT TRANSISTORS THROUGH CONTROLLED ELECTROCHEMICAL MODIFICATION

(75) Inventors: Kannan Balasubramanian, Navi Mumbai (IN); Marko Burghard, Leonberg (DE); Klaus Kern, Waldenbuch (DE)

(73) Assignee: Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 0 days.

(21) Appl. No.: 10/903,854

(22) Filed: Jul. 29, 2004

(65) Prior Publication Data
US 2006/0024871 A1 Feb. 2, 2006

(51) Int. Cl.
*H01L 21/336* (2006.01)
*H01L 39/76* (2006.01)
(52) U.S. Cl. ............... 438/292; 257/213; 977/847
(58) Field of Classification Search ............... 438/292
See application file for complete search history.

(56) References Cited

U.S. PATENT DOCUMENTS

| 6,740,900 B1 * | 5/2004 | Hirai ............................ 257/40 |
| 2004/0023514 A1 * | 2/2004 | Moriya et al. ............... 438/778 |

OTHER PUBLICATIONS

Bahr, Jeffrey L. et al.; "Functionalization of Carbon Nanotubes by Electrochemical Reduction of Aryl Diazonium Salts: A Bucky Paper Electrode"; 2001, *J. Am. Chem. Soc.*, vol. 123, pp. 6536-6542.
Bockrath, Marc et al.; "Single-Electron Transport in Ropes of Carbon Nanotubes"; 1997, *Science*, vol. 275, pp. 1922-1925.
Bonard, Jean-Marc et al.; "Tuning the Field Emission Properties of Patterned Carbon Nanotube Films"; 2001, *Adv. Mater.*, vol. 13, No. 3, pp. 184-188.
Chen, Y. et al.; "Chemical attachment of organic functional groups to single-walled carbon nanotube material"; 1998, *Journal of Materials Research*, vol. 13, No. 9, pp. 2423-2431.
Cui, Yi et al.; "Nanowire Nanosensors for Highly Sensitive and Selective Detection of Biological and Chemical Species"; 2001, *Science*, vol. 293, pp. 1289-1292.
Cui, J.B. et al.; "Room Temperature Single Electron Transistor by Local Chemical Modification of Carbon Nanotubes"; 2002, *Nano Letters*, vol. 2, No. 2, pp. 117-120.

(Continued)

*Primary Examiner*—W. David Coleman
(74) *Attorney, Agent, or Firm*—Townsend and Townsend and Crew

(57) ABSTRACT

The invention relates to a method of fabricating a structure with field-effect transistors each comprising a source electrode, a drain electrode, a channel extending between the source and drain electrodes and at least one gate electrode associated with the channel for controlling the conductance of the channel, wherein the channel comprises one or more semiconducting single-wall carbon nanotubes. The method includes the steps of
a) depositing a plurality of single-wall carbon nanotubes on a substrate, the carbon nanotubes including a mixture of metallic carbon nanotubes and semiconducting carbon nanotubes,
b) providing before or after step a) source and drain electrodes on the substrate so that one or more carbon nanotubes extend between the source and drain electrodes,
c) applying a variable gate voltage to switch off the semiconducting tubes extending between the source and drain electrodes,
d) wetting the surface of the structure including the transistors with a chemical to achieve a chemical bond between a radical supplied by the chemical and some carbon atoms of the metallic nanotubes, whereby these metallic nanotubes become non-conductive.

20 Claims, 4 Drawing Sheets

OTHER PUBLICATIONS

Cui, J.B. et al.; "Carbon nanotube memory devices of high charge storage stability"; 2002, *Applied Physics Letters,* vol. 81, No. 17, pp. 3260-3262.

Downard, Alison J.; "Electrochemically Assisted Covalent Modification of Carbon Electrodes"; 2000, *Electroanalysis,* vol. 12, No. 14, pp. 1085-1096.

Dresselhaus, M.S. et al.; "Phonons in carbon nanotubes"; 2000, *Advances in Physics,* vol. 49, No. 6, pp. 705-814.

Georgakilas, Vasilios et al.; "Organic Functionalization of Carbon Nanotubes"; 2002, *J. Am. Chem. Soc.,* vol. 124, No. 5, pp. 760-761.

Hirsch, Andreas; "Funktionalisierung von einwandigen kohlenstoffnanorlhren"; 2002, Angew. Chem., vol. 114, No. 11, pp. 1933-1939.

Kong, Jing et al.; "Nanotube Molecular Wires as Chemical Sensors"; 2000, *Science,* vol. 287, pp. 622-625.

Kooi, Steven Earl et al.; "Electrochemical Modification of Single Carbon Nanotubes"; 2002, *Angew. Chem. Int. Ed.,* vol. 41, No. 8, pp. 1353-1355.

Martel, R. et al.; "Single- and multi-wall carbon nanotube field-effect transistors"; 1998, *Applied Physics Letters,* vol. 73, No. 17, pp. 2447-2449.

Maultzsch, J. et al.; "Rama characterization of boron-doped multiwalled carbon nanottubes"; 2002, A*pplied Physics Letters,* vol. 81, No. 14, pp. 2647-2649.

Mews, Alf et al.; "Raman Imaging of Single Carbon Nanotubes"; 2000, *Adv. Mater.,* vol. 12, No. 16, pp. 1210-1214.

Nygard, J. et al.; "Electrical transport measurements on single-walled carbon nanotubes"; 1999, *Appl. Phy.,* vol. 69, pp. 297-304.

Odom, Teri Wang et al.; "Structure and Electronic Properties of Carbon Nanotubes"; 2000, *J. Phys. Chem. B,* vol. 104, No. 13, pp. 2794-2809.

Tans, Sander J. et al.; "Room-temperature transistor based on a single carbon nanotube"; 1998, *Nature,* vol. 393, pp. 49-52.

Zhao, Jialong et al.; "Diameter-Dependent Combination Modes in Individual Single-Walled Carbon Nanotubes"; 2002, *Nano Letters,* vol. 2, No. 8, pp. 823-826.

"Single-Wall Carbon Nanotube Field-Effect"; 2003, nerac.com, Retro Search, pp. 1-70.

\* cited by examiner

METHOD OF FABRICATING CARBON NANOTUBE FIELD-EFFECT TRANSISTORS THROUGH CONTROLLED ELECTROCHEMICAL MODIFICATION

BACKGROUND OF THE INVENTION

1. Field of the Invention

The present application relates to a method of fabricating a structure with field-effect transistors each comprising a source electrode, a drain electrode, a channel extending between the source and drain electrodes and at least one gate electrode associated with the channel for controlling the conductance of the channel, wherein the channel comprises one or more semiconducting single-wall carbon nanotubes.

2. Prior Art

Single-wall carbon nanotubes (SWCNTs) are prospective components of nanoscale and molecular electronic devices. For instance, field-effect transistors (FETs) have been successfully fabricated from single semiconducting SWCNTs. The overall performance of SWCNT-FETs has been reported to be superior to that of state-of-the-art silicon-based MOSFETs, as reflected in the values of the drive current and transconductance being higher by a factor of four. Moreover, devices implementing CVD-grown SWCNTs have shown extremely high hole mobilities of up to 9000 $cm^2/Vs$. With palladium as the electrode material, Schottky-barrier-free ballistic FETs have recently been realized, which exhibit high drive currents, good transconductance and switching ratios of $10^6$.

In contrast to the remarkable achievements made with devices based upon individual SWCNTs, the use of nanotubes in large-scale electronics still faces several limitations which arise from the fact that all fabrication procedures developed to date yield mixtures of metallic and semiconducting tubes. In addition, the SWCNTs produced by bulk methods such as the arc discharge or HiPCO process (high pressure pyrolysis of carbon monoxide) are entangled in bundles. As a consequence, the electrical transport through such SWCNT ensembles is usually dominated by metallic pathways, and therefore only weak electric field effects on the conductance are attainable. For the goal of fabricating nanotube FETs two strategies have heretofore been followed to overcome this problem.

First, various solution-based techniques have been devised to separate metallic nanotubes from semiconducting ones, i.e. before they are adsorbed onto the substrate. These techniques rely upon differences in the physisorption properties, the capability to undergo charge transfer reactions or the different dielectric constants of the two types of SWCNTs:

For example, dispersing a SWCNT soot with octadecylamine (ODA) in tetrahydrofuran results in a physisorbed coating of ODA onto the sidewalls of the semiconducting SWCNTs due to the higher affinity of the latter to ODA. The metallic SWCNTs can then be separated by precipitation.

Similarly, the SWCNTs can be dispersed with single-stranded DNA yielding SWCNTs wrapped with DNA molecules. Anion exchange chromatography can then be used to extract an enriched fraction of metallic tubes utilizing the difference in surface charge between the DNA-metallic and the DNA-semiconducting SWCNTs.

Still another method relies on the increased capability of charge-transfer complex formation by bromine with the metallic nanotubes, resulting in the ability to separate one type from the other just by using centrifugation. Recently, it has been demonstrated that the varying dielectric constants of the metallic and semiconducting tubes can be utilized in separating the metallic nanotubes alone from a suspension through alternating current dielectrophoresis.

However, in none of these techniques can a 100% separation of the metallic nanotubes from the semiconducting ones be achieved, which is mainly due to the fact that the methods used are not selective exclusively to either the metallic or the semiconducting tubes.

The other approach utilizes the fact that the semiconducting SWCNTs can be turned to the insulating (OFF) state via application of a gate voltage. By ramping the drain-source voltage to sufficiently high potentials under the presence of oxygen, it is possible to burn off the metallic nanotubes. This destructive approach which has until now successfully been applied to individual SWCNT bundles has the disadvantage that adjacent semiconducting tubes may be affected in a negative way. Specifically, high current densities in the metallic nanotubes can heat up adjacent semiconducting tubes in the bundle thereby inducing defects in the semiconducting SWCNTs which can deteriorate device parameters such as charge carrier mobility.

SUMMARY OF THE INVENTION

It is an object of the invention to provide a method of fabricating a structure with SWCNT-FETs which overcomes the above problems.

A particular object of the invention is to provide a method of obtaining FETs in which metallic SWCNTs no longer pose a problem and indeed without any substantial negative effect on the semiconducting SWCNTs.

The object is attained by the method which includes the steps of (a) depositing a plurality of single-wall carbon nanotubes on a substrate, the carbon nanotubes comprising a mixture of metallic carbon nanotubes and semiconducting carbon nanotubes, (b) providing before or after step (a) source and drain electrodes on the substrate so that one or more carbon nanotubes extend between the source and drain electrodes, (c) applying a variable gate voltage to switch off the semiconducting tubes extending between the source and drain electrodes, and (d) wetting the surface of the structure including the transistors with a chemical to achieve a chemical bond between a radical supplied by the chemical and some carbon atoms of the metallic nanotubes, whereby these metallic nanotubes become non-conductive.

The method of the invention makes the fabrication of SWCNT-FETs possible in a generic manner, which extends the scope of the second approach mentioned at the beginning. Specifically, electrochemical modification (ECM) is used to eliminate the current carrying capability of the metallic SWCNTs within an ensemble of nanotubes. Electrochemistry is particularly well suited for this purpose because of the ability to control the electrochemical potential in a precise manner and hence the reactivity of the individual nanotubes.

The ECM-based method has the potential to improve the performance of existing FETs consisting of SWCNT networks which display poor switching ratios due to the coexistence of metallic and semiconducting tubes.

A major advantage of the electrochemical approach is the creation of a coupling species directly at the surface of the conducting tubes, which enables a highly localized functionalization.

The elimination of the current carrying capability of metallic SWCNTs within a bundle of nanotubes is performed by electrochemically generating reactive radicals, specifically reactive phenyl radicals, which are able to covalently attach in high densities to the sidewalls of the nanotubes. Thereby homogeneous molecular layers of controllable thickness can be grown on individual nanotubes through electrochemical modification. As a result, the resistance of metallic SWNTs can be increased by several orders of magnitude after ECM, in particular after reductive ECM.

By blocking the modification of semiconducting SWCNTs at the same time by the application of a variable gate voltage to switch off the semiconducting nanotubes between the source and drain electrodes, the conductance of the metallic nanotubes in a SWCNT ensemble can be eliminated selectively, resulting in high performance FETs. The modification of semiconducting nanotubes can be enabled or blocked by varying the history of gate potential scans before performing electrochemistry, as will now be explained in more detail.

To be able to address selectively only the metallic nanotubes in an ensemble of SWCNTs the ECM is preferably performed in a state where the semiconducting SWCNTs are depleted of carriers so that they do not undergo any charge transfer, thereby blocking their reactivity. The hysteresis of the gate dependence of conductance proves useful in achieving this depletion state in the following manner. When the gate voltage is progressively increased from zero to a positive maximum gate voltage and then reduced back to zero, devices comprising purely semiconducting SWCNTs are found to remain in the conducting or ON state. Similarly, the devices can be switched to the OFF state after the gate voltage has been scanned from zero to a negative maximum voltage and then brought back to zero.

Thus, at the same zero gate potential the semiconducting nanotubes are either in an ON state or in an OFF state, just by controlling the previous history of the device. This is important because the ECM is best performed without application of an in-situ gate voltage to avoid insulation problems between the solution and the gate electrode.

Applying the electrochemical modification to semiconducting nanotubes in the OFF state results in almost no change in the gate dependence. The term "gate dependence" will be understood to mean the desired ability to turn the FET on or off as a function of the applied gate voltage.

In contrast, when the same semiconducting SWCNT is subjected to ON state ECM the conductance decreases by four orders of magnitude for all gate voltages. This signifies that the semiconducting nanotubes are depleted of carriers and prevented from reacting when they are switched to the OFF state and ECM is performed. On the other hand, application of the same ECM to a bundle of purely metallic SWCNTs after switching to the OFF state results in a decrease of the conductance of the modified metallic SWCNTs by four orders of magnitude.

The persistence of the ON or OFF state is in the order of a few minutes after the gate voltage is brought back to zero. The ECM is normally performed within this period.

On this basis, selective reaction at the metallic nanotubes can be achieved after gate-induced switching of the semiconducting nanotubes to the OFF state, yielding a purely semiconducting SWCNT channel between the source and drain electrodes. In other words, by tuning the gate voltage and switching the semiconducting tubes to the OFF state and performing ECM on a SWCNT bundle, only the metallic nanotubes are modified. After the ECM, the modified metallic nanotubes remain insulating due to the high resistance, and purely semiconducting SWCNT channels are obtained between the source and drain electrodes.

Preferably, the chemical used in step (d) includes a diazonium salt. The use of a diazonium salt leads to an electrochemical modification of the semiconducting nanotubes according to a reductive coupling scheme if OFF state ECM is performed. In this case of reductive ECM based on a diazonium salt it is assumed that reductively created phenyl radicals form covalent (C—C) bonds to the nanotube, associated with the introduction of a sizable density of $sp^3$-hybridized carbon atoms. This reductive diazonium coupling to metallic SWCNTs increases the resistance of the SWCNT by up to four orders of magnitude.

DETAILED DESCRIPTION OF THE PREFERRED EMBODIMENTS

Figure 1:
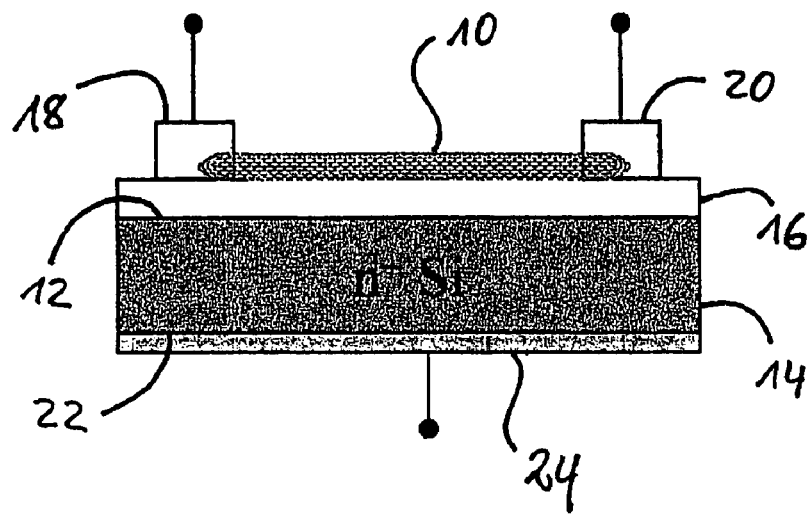
FIG. 1 is a cross-sectional view of a single-wall carbon nanotube field-effect transistor (SWCNT-FET) having a gate electrode at the back side, i.e. a back gate.

A single-wall carbon nanotube field-effect transistor (SWCNT-FET) as shown in FIG. 1 is fabricated by dispersing single-wall carbon nanotubes (SWCNTs) 10, for instance produced by the HiPCO process (high pressure pyrolysis of carbon monoxide) as performed by Tubes@Rice, Lexington, in a surfactant solution and depositing these on a substantially flat front surface 12 of an $N^+$-doped silicon substrate 14 which is covered by a 200 nm thick layer 16 of thermally grown silicon oxide.

If the surfactant solution containing the SWCNTs 10 is poured on a substrate 14 having a flat surface 12 the nanotubes 10 typically arrange themselves with random orientation. In contrast, a predetermined orientation of the SWCNTs can be achieved by, for instance, providing the substrate with a periodic structure comprising peaks and valleys preferably extending in parallel to each other. When the surfactant solution containing the SWCNTs is distributed across a so-patterned surface the SWCNTs will at least predominantly come to rest in the valleys. Hence, the resulting FETs will be aligned in parallel with the periodic structure.

After depositing the SWCNTs 10 on the substrate 14, AuPd electrodes 18, 20 having a thickness of about 15 nm are formed with about 1.4 μm separation on top of the SWCNTs 10 through electron beam lithography.

The AuPd electrodes 18, 20 function as source and drain electrodes 18, 20 and the SWCNT 10 extending between the electrodes 18, 20 serves as a channel between the source and drain electrodes 18, 20. Alternatively, the source and drain electrodes 18, 20 can be applied to the substrate prior to the deposition of the SWCNTs.

The density of the nanotubes 10 is chosen such that between 1 and 10 individual SWCNTs 10 or bundles of SWCNTs 10 connect the two electrodes 18, 20.

Further, a back surface 22 of the substrate 14 opposite from the front surface 12 is provided with a gate electrode 24 associated with the channel 10 for controlling the conductance of the channel 10.

Figure 2:
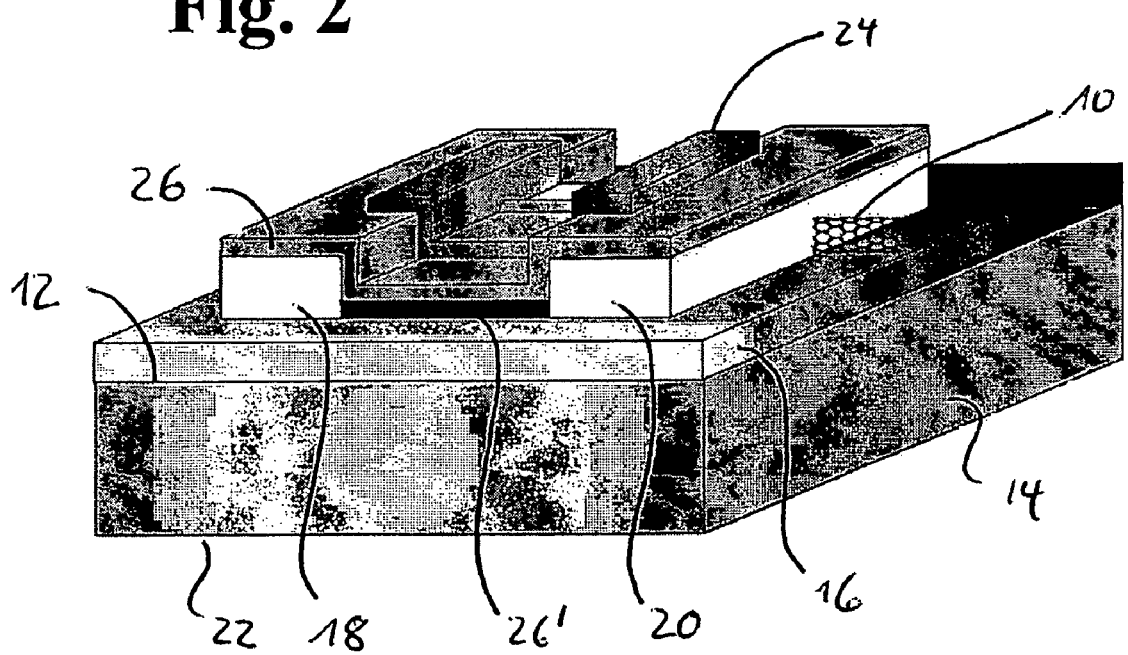
FIG. 2 is a perspective view of an SWCNT-FET having a top gate electrode.

FIG. 2 shows an alternative embodiment of an SWCNT-FET which differs from the SWCNT-FET of FIG. 1 in that the gate electrode 24 is not arranged on the back surface 22 of the substrate 20 but on its top, as are the source and drain electrodes 18, 20 which can e.g. be realized as described in connection with FIG. 1.

The source and drain electrodes 18, 20 and the SWCNT 10 are covered by an insulating layer 26 made from silicon dioxide on top of which the gate electrode 24 is arranged. This can be done by using any known conventional technique. Alternatively, the insulating layer 26 can be made from any other suitable insulating oxide material, such as e.g. $Al_2O_3$, or from an insulating polymer material.

The reference numeral 26' refers to a layer of insulating material, e.g. $SiO_2$, which fills in the space between the source and the drain electrodes 18, 20 around the nanotubes(s) 10.

Since, in this embodiment, all electrodes are on the top of the device the substrate could also be made from any suitable insulating material.

Figure 3:
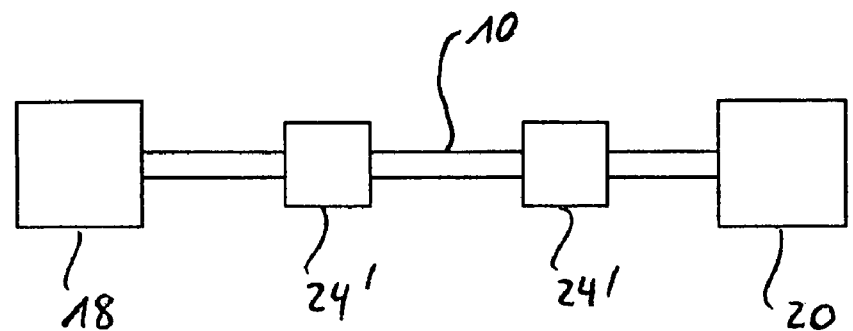
FIG. 3 shows an SWCNT-FET of the type shown in FIG. 2 having two top gate electrodes associated with the transistor channel.

As is illustrated in FIG. 3, it is also possible to arrange two or more gate electrodes 24' on the insulating layer 26. By associating two or more gate electrodes 24' with the channel 10 it is possible to operate the SWCNT-FET according to AND/OR functions.

The fabricated SWCNT-FET samples can be classified into three categories according to the electrical transport properties of their channels 10: In a first type, almost no gate dependence of conductance is observed, indicating the presence of exclusively metallic SWCNTs 10. A second type of samples displays a strong gate dependence of conductance of at least four orders of magnitude, which is representative of transport through purely semiconducting SWCNTs 10. In a third type, a weak gate dependence of conductance is detected due to the presence of a mixture of both metallic and semiconducting SWCNTs 10 in the ensemble.

According to the method of the invention the metallic SWCNTs are selectively electrochemically modified to become non-conductive. In order to achieve this, advantage is taken of a hysteresis in the gate dependence of conductance of the semiconducting nanotubes in the following manner:

After sweeping the gate potential to a positive value ($\geq +20$ V) and returning to zero, devices comprising semiconducting SWCNTs are found to remain in a conducting or ON state. Similarly, the devices can be switched to an OFF state by sweeping the gate voltage to a negative value ($\leq -20$ V) and going back to zero. The stability of the ON or OFF state is in the order of several minutes, typically 10 to 15 min, which is sufficient to perform the electrochemical modification (ECM) of the metallic SWCNTs while the semiconducting nanotubes are in the ON or OFF state. Hence, the ECM can be performed without the need for in-situ gate control.

Figure 4:
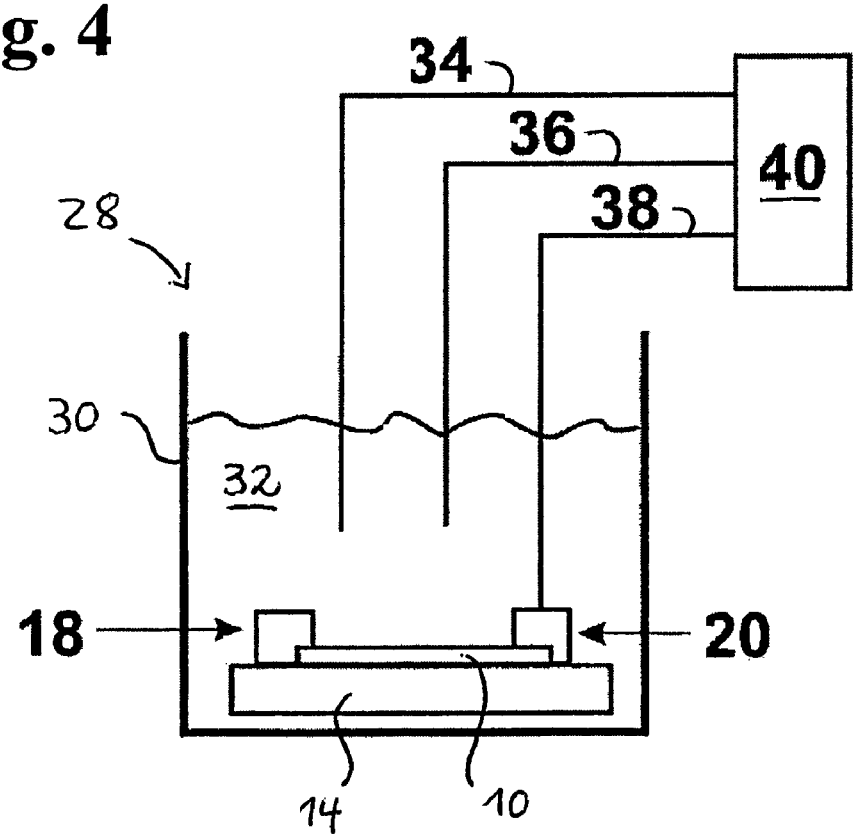
FIG. 4 is a cross-sectional view of a setup used to perform electrochemical modification of SWCNTs.

FIG. 4 shows a setup suitable to carry out the electrochemical modification of the SWCNTs 10. The setup comprises a micro cell 28 including a container 30 which has a capacity of, for instance, about 500 μL. The container 30 is filled with an electrolyte solution 32. A platinum counter electrode 34 and a platinum pseudoreference electrode 36 extend into the electrolyte solution 32.

The electrolytic solution 32 has a certain electrochemical potential. When an electrode is immersed in the electrolytic solution 32, the voltage measured varies from material to material depending on the work function of the respective material. Hence, to have a common reference, a known electrode material (Platinum here) is used and all voltages are measured with respect to this reference. This is the reason why the voltages given below are specified versus Pt which is the reference electrode 36.

The setup further comprises a tungsten needle probe 38 which is used to make contact with the source or drain electrodes 18, 20 on the front surface 12 of the substrate 14, thus enabling the SWCNTs 10 extending between these electrodes 18, 20 to function as the working electrode. A potentiostat 40, e.g. a Solartron 1258, is used to control the potential of the nanotube working electrode 10 versus the platinum reference electrode 36.

Reductive coupling of 4-nitrobenzene diazonium tetrafluoroborate, $O_2N(C_6H_4)-N_2^+BF_4^-$ (10 mN), to metallic SWCNTs 10 can be perfomed with 0.1 M $LiClO_4$ in N,N-dimethylformamide at a potential of, for instance, -1.3 V versus Pt.

It is noted that oxidative coupling of 4-aminobenzylamine, $H_2N(C_6H_4)-CH_2NH_2$ (10 mN), to the metallic SWCNTs 10 can be performed in ethanol as the electrolyte solution 32, the ethanol containing 0.1 M $LiClO_4$ as the supporting electrolyte, and by applying a potential of, for example, +0.75 V versus Pt. However, the electrical properties of the metallic nanotubes seem to be unaffected by such an oxidative coupling. Oxidative coupling is therefore not preferred.

In both coupling schemes, applying the potential for a time of about 120 s is sufficient to obtain a molecular coating on the metallic SWCNTs due to polymerization of electrochemically generated phenyl radicals at the metallic SWCNT/electrolyte interface. This coating modifies the conductance of the SWCNTs as is described below.

To optimize the parameters of the ECM, for example the concentration of the diazonium salt and the magnitude and duration of the applied potential with respect to maximum preservation of the semiconducting nanotubes, control studies were initially carried out with pure semiconducting and pure metallic tubes after gate tuning. In order to obtain reproducible results the samples were heated at 100° C. for 2 hours immediately after ECM, to ensure removal of physissorbed solvent molecules.

Figure 5:
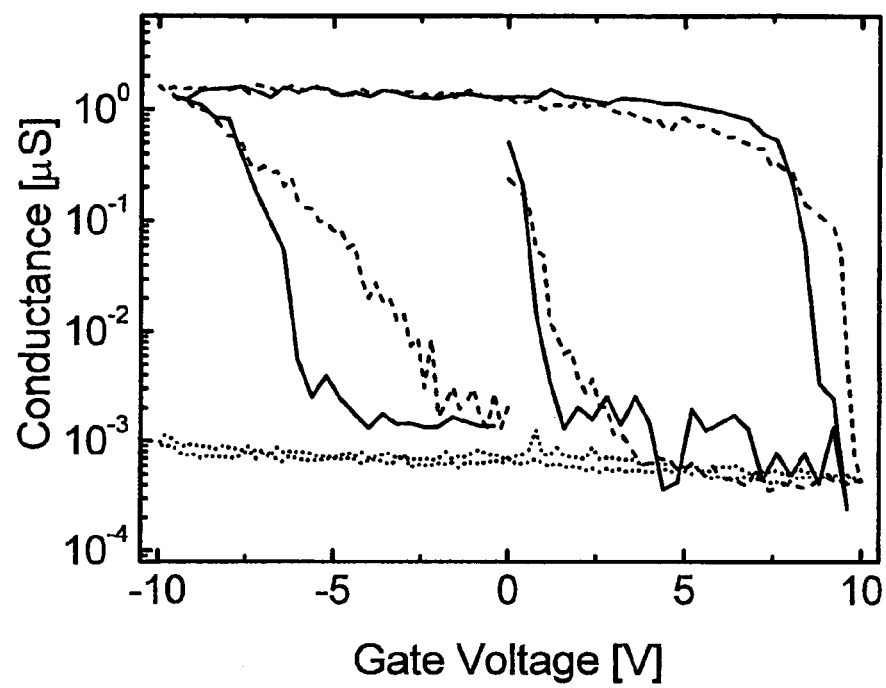
FIG. 5 is a graph demonstrating the gate dependence of conductance of an individual semiconducting SWCNT before electrochemical modification (solid line) and after electrochemical modification in the OFF state (broken line) and in the ON state (dotted line).

The application of a voltage of about -280 mV versus Platinum for 30 s in a 10 mM 4-nitrobenzene diazonium salt solution in N,N-dimethylformamide (DMF), with 0.1 N lithium perchlorate ($LiClO_4$) as background electrolyte, is found to cause only minor changes in the conductance of an individual semiconducting nanotube in the OFF state as is demonstrated in FIG. 5. Here, the solid curve is the initial gate dependence of conductance, while the broken curve corresponds to the gate dependence after ECM in the OFF state.

On the other hand, after subjecting the same semiconducting SWCNT in the ON state to ECM with the same parameters, the conductance is reduced by three orders of magnitude for all gate voltages (dotted curve in FIG. 5).

Figure 6:
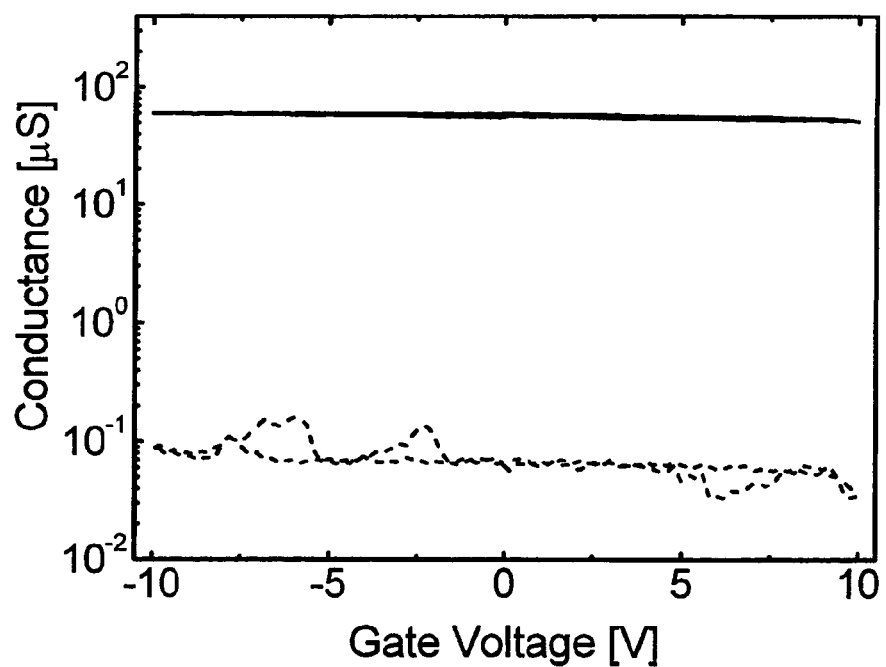
FIG. 6 is a graph illustrating the conductance of a purely metallic SWCNT bundle as a function of gate voltage before (solid line) and after (broken line) electrochemically modifying the metallic SWCNTs under OFF state conditions of semiconducting nanotubes.

FIG. 6 is a graph illustrating the conductance of a purely metallic SWCNT bundle as function of gate voltage before (solid line) and after (broken line) modification of the metallic SWCNTs under OFF state conditions of the semiconducting tubes, using the same parameters that were applied to the semiconducting SWCNTs above. The modified metallic tubes show a strong increase in resistance, specifically, the conductance is seen to drop by four orders of magnitude.

As a result, the semiconducting SWCNTs are unaffected when reductive ECM is performed after switching the device to the OFF state while the metallic SWCNTs are modifiable under the same conditions.

Figure 7:
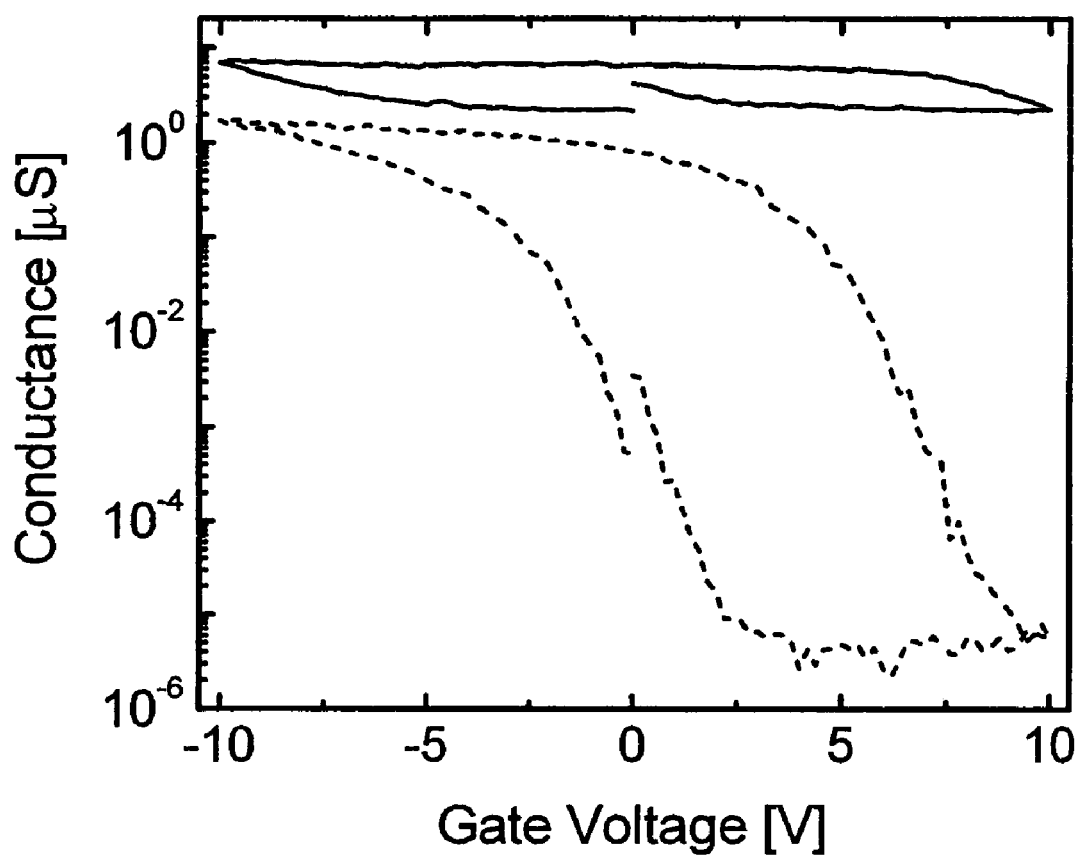
FIG. 7 is a graph showing the gate dependence of conductance of an ensemble of SWCNTs containing a mixture of both metallic and semiconducting SWCNTs before (solid line) and after (broken line) electrochemical modification.

FIG. 7 shows the conductance as a function of gate voltage of an ensemble of SWCNTs containing a mixture of both metallic and semiconducting SWCNTs. Initially, the bundle displays a weak gate dependence of conductance (solid line in FIG. 7).

After applying the above methodology to the ensembles of SWCNTs, i.e. after performing ECM in the OFF state with the aforementioned parameters, the bundle thickness is found to be slightly increased, which results from the formation of a molecular coating on the metallic SWCNTs due to polymerization of the electrochemically generated phenyl radicals at the metallic SWCNT/electrolyte interface.

The gate dependence of conductance of the modified bundle (shown by the broken line in FIG. 7) displays a significant increase in the ON to OFF ratio from 3 before electrochemical modification to about $10^6$ afterwards. The shape of the curve after ECM as well as the magnitude of the ON current are comparable to those of the individual semiconducting SWCNTs shown in FIG. 5, indicating that the contribution of the metallic SWCNTs to the transport has been completely suppressed and the device now acts as a purely semiconducting FET.

Even if metallic SWCNTs in an ensemble of nanotubes have been eliminated in accordance with the method of the invention, the present SWCNT-FETs typically comprise more than one electrically active semiconducting nanotube. However, it is still instructive to compare their device characteristics with those of single-nanotube FETs:

While FETs in accordance with the present teaching, which typically comprise more than one electrically active semiconducting nanotube, exhibit a room-temperature transconductance of about 10 S/cm, values of up to 23 S/cm are documented for the best single-nanotube FET to date. This difference can largely be attributed to the compact device architecture of the known single-nanotube FETs, in which very thin gate oxides of about 15 nm have been utilized. The value of 10 S/cm is a very good value having regard to the relative ease with which the FETs can be fabricated.

The switching ratio that is obtained in the devices which have been manufactured according to the method of the invention is of the order of $10^6$ similar to ratios obtained in other devices.

The hole mobility determined by assuming a classical FET model is found to be about 1000 $cm^2$/Vs at room temperature for the electrochemically modified SWCNT-FETs, whereas the best device fabricated using single nanotubes showed a mobility of 9000 $cm^2$/Vs. The higher mobility in the latter case is suggestive of the superior structural quality of SWCNTs grown from solid-supported catalyst particles via chemical vapor deposition (CVD) in comparison with the HiPCO tubes used in the present case. Again, the value of 1000 $cm^2$/Vs is a very good value having regard to the relative ease with which the FETs can be fabricated.

Based on the recognition that aromatic diazonium salts in aqueous solutions react selectively with metallic nanotubes under certain conditions, control experiments have been performed by exposing individual metallic and semiconducting SWCNTs to the diazonium salt separately in DMF and in water for up to 15 hours without applying a potential. This was followed by heating the sample to 100° C. for 2 hours, again to remove physissorbed solvent molecules. However, under these conditions changes in conductance could be observed neither for semiconducting nanotubes nor for metallic nanotubes.

The measurements described in this application (cf. FIGS. 5 to 7) have been carried out under ambient conditions and hence display a strong hysteresis, which is attributed to oxygen-related charge traps either in the $SiO_2$ dielectric or very close to the nanotube or to the presence of $SiO_2$ surface-bound water molecules. In order to eliminate this parasitic hysteresis effect the samples can, for instance, be annealed in vacuum followed by covering them with a capping layer after the electrochemical modification.

The method of the invention presents a generic fabrication route for SWCNT-FETs, which combines electrochemistry and gate-induced modulation of conductivity. The modification of semiconducting nanotubes can be enabled or blocked by varying the history of gate potential scans before performing electrochemistry. Specifically, the gate voltage can be tuned in such a way that the semiconducting nanotubes are electrically switched off and the ECM then addresses only the metallic SWCNTs. In this manner the conduction through the metallic nanotubes in an SWCNT ensemble can selectively be eliminated, resulting in high performance FETs. In particular, the ECM-based method is suitable to improve the performance of existing FETs consisting of SWCNT networks displaying poor switching ratios due to the coexistence of metallic and semiconducting nanotubes.

The invention claimed is:

1. A method of fabricating a structure with field-effect transistors, said transistors each comprising a source electrode, a drain electrode, a channel extending between the source and drain electrodes and at least one gate electrode associated with the channel for controlling the conductance of the channel, wherein the channel comprises one or more semiconducting single-wall carbon nanotubes, the method including the steps of
   a) depositing a plurality of single-wall carbon nanotubes on a substrate, said carbon nanotubes comprising a mixture of metallic carbon nanotubes and semiconducting carbon nanotubes,
   b) providing before or after step a) source and drain electrodes on the substrate so that one or more carbon nanotubes extend between the source and drain electrodes,
   c) applying a variable gate voltage to switch off the semiconducting tubes extending between the source and drain electrodes,
   d) wetting the surface of the structure including the transistors with a chemical to achieve a chemical bond between a radical supplied by said chemical and some carbon atoms of the metallic nanotubes, whereby these metallic nanotubes become non-conductive.

2. A method in accordance with claim 1 and comprising the further step of
 e) providing before or after step b) one or more gate electrodes on a surface of the substrate opposite from said source and drain electrodes.

3. A method in accordance with claim 1 and comprising the further step of
 e) providing an insulating layer overlying said carbon nanotubes and said source and drain electrodes and depositing one or more gate electrodes on said insulating layer.

4. A method in accordance with claim 3, wherein said insulating layer has a thickness in the range from a few nanometers to 50 nanometers.

5. A method in accordance with claim 3, wherein said insulating layer is selected from the group comprising an insulating oxide layer and an insulating polymer layer.

6. A method in accordance with claim 5, wherein said insulating oxide layer is selected to be $SiO_2$.

7. A method in accordance with claim 5, wherein said insulating oxide layer is selected to be $Al_2O_3$.

8. A method in accordance with claim 1, wherein the chemical used in step d) includes a diazonium salt.

9. A method in accordance with claim 8, wherein said chemical also includes a solvent for said salt.

10. A method in accordance with claim 9, wherein said chemical also includes a background electrolyte.

11. A method in accordance with claim 10, wherein said salt is a 4-nitrobenzene diazonium tetrafluorborate, said solvent includes N,N-dimethylformamide (DMF) and said electrolyte is $LiClO_4$ dissolved in DMF.

12. A method in accordance with claim 1, wherein the substrate is immersed in a bath of said chemical, said bath containing a reference electrode, a counter-electrode and a working electrode contacting one of said source and drain electrodes.

13. A method in accordance with claim 1, wherein said FETs are parallel to a surface grown on said substrate.

14. A method in accordance with claim 1, wherein said substrate is provided with a periodic structure comprising peaks and valleys and said FETs are aligned with said valleys.

15. A method in accordance with claim 1, wherein said source and drain electrodes are deposited with a spacing in the range from 100 nm to a few µm.

16. A method in accordance with claim 15, wherein a plurality of gate electrodes is provided for each said channel.

17. A method in accordance with claim 1, wherein said substrate is a silicon substrate having first and second faces, there being a silicon dioxide layer provided on said first face and a back gate provided on said second face.

18. A method in accordance with claim 1, wherein step c) comprises the steps of starting with a gate voltage of zero, progressively increasing the voltage from zero to a maximum positive or negative value and then reducing said maximum positive or negative value back to zero.

19. A method in accordance with claim 1, wherein step d) is carried out with no applied gate voltage.

20. A method in accordance with claim 1, wherein step d) is carried out to affect a reductive coupling of said radical to the metallic nanotubes.

* * * * *